United States Patent [19]

Stalley

[11] Patent Number: 5,663,868
[45] Date of Patent: Sep. 2, 1997

[54] STACKABLE ELECTRONIC EQUIPMENT ASSEMBLY WITH IMPROVED CIRCUIT BOARD COOLING ARRANGEMENT

[75] Inventor: Anthony Donald Stalley, Ascot, United Kingdom

[73] Assignee: Questech Limited, Wokingham, United Kingdom

[21] Appl. No.: 528,166

[22] Filed: Sep. 14, 1995

[30] Foreign Application Priority Data

Sep. 14, 1994 [GB] United Kingdom ............... 9418534

[51] Int. Cl.[6] ........................................... H05K 7/20
[52] U.S. Cl. ................ 361/695; 165/80.3; 361/721; 454/184
[58] Field of Search ................. 454/184; 165/122, 165/126, 80.3; 361/687, 690, 692, 694, 695, 720, 721, 736, 752, 784, 788, 790, 796, 816, 818; 415/208.1, 213.1, 214.1

[56] References Cited

U.S. PATENT DOCUMENTS 5,063,477  11/1991  Paggen ........................ 361/384
5,168,171  12/1992  Tracewell ..................... 307/64
5,398,161   3/1995  Roy ............................ 361/727
5,428,503   6/1995  Matsushima ................... 361/695
5,432,674   7/1995  Hardt .......................... 361/694
5,493,474   2/1996  Schkrohowsky ................. 361/695

FOREIGN PATENT DOCUMENTS 1561689  2/1980  United Kingdom.

*Primary Examiner*—Gerald P. Tolin
*Attorney, Agent, or Firm*—Jacobson, Price, Holman & Stern, PLLC

[57] ABSTRACT

A cabinet for electronic equipment comprises an array of printed circuit boards stacked in horizontal planes. The circuit boards are interconnected by a vertically extending rear mother board, and the cabinet includes a plenum chamber defined by a partition having a plurality of vertically arrayed ventilation openings through which air can be drawn from the lateral spaces between the circuit boards and exhausted from the rear of the cabinet by a blower.

6 Claims, 1 Drawing Sheet

STACKABLE ELECTRONIC EQUIPMENT ASSEMBLY WITH IMPROVED CIRCUIT BOARD COOLING ARRANGEMENT

BACKGROUND OF THE INVENTION

This invention concerns STACKABLE ELECTRONIC EQUIPMENT ASSEMBLY WITH IMPROVED CIRCUIT BOARD COOLING ARRANGEMENT.

For many years it has been common practice to design and build professional electronic equipment to fit cabinets that conform to internationally agreed dimensions. These cabinets, with a standard width of nineteen inches, can be stacked vertically, in multiples of one unit of 1.75 inches, in nineteen inches wide racks and cubicles specifically made for this purpose. These '19 inch' racks and cubicles have side flanges pre-drilled with a pattern of holes repeated every 1.75 inches (1'U') to simplify the fixing of any vertical combination of 'rack-mount' equipment. Each piece of 'rack-mount' equipment has corresponding side flanges pierced with bolt holes at N'U' intervals that align precisely with the pattern of holes in the cubicle flanges. This internationally agreed format permits the assembly of any configuration of cabinets of various sizes to be stacked one above the other, limited only by the available height in a standard '19 inch' wide cubicle.

To accommodate the increasing complexity of electronic equipment it has become common practice to assemble large quantities of electronic components and integrated circuits onto a plurality of printed circuit boards (PCBs) that plug into a suitable cabinet, vertically like books on a bookshelf, or horizontally in layers one above the other, in such a way that each PCB may be removed quickly for servicing or replacement, preferably from the front of the equipment cabinet whilst it remains rack-mounted in the cubicle.

An assembly of vertical PCBs has the advantage that heat dissipated by the circuit components on each PCB rises by natural convection between the PCBs, assisting the cooling process and helping to avoid localised heating that can lead to premature component failure. In all but the smallest examples, cooling must be enhanced by fitting electric fans to the equipment, forcing air to pass between the PCBs, to assist in the removal of heat from the cabinet. With vertically mounted PCBs, forced air cooling usually requires a plenum above and sometimes also below the array of PCBs to form ducts for the cooling air supply and hot air exhaust. This unfortunately adds to the height of the equipment cabinet consuming more of the vertical space available in a rack-mount cubicle. A further disadvantage of an assembly of vertically mounted PCBs is that the maximum number of PCBs that can be accommodated in such an equipment is ultimately determined by the available internal width of a '19 inch' cabinet. A less complex equipment using fewer PCBs with this vertical PCB format suffers the disadvantage of inefficient use of the same volume of 'rack-mount' space, since the cabinet must still occupy the full '19 inch' standard width.

A solution to these problems can be found in using an arrangement of PCBs in the horizontal plane, stacked vertically one above the other. If a PCB size is chosen to suit the dimensions of the standard '19 inch' cabinet, then differing numbers of such PCBs can be stacked according to the complexity of the equipment in cabinets that increment in height by multiples of '1U'. Natural convection cooling has little beneficial effect on the circuit components on each horizontal PCB and serious local heating problems will be encountered unless effective forced air cooling is provided.

Filtered air may be supplied conveniently through the front of the cabinet where access is needed as well for removal of PCBs for normal maintenance, but exhausting the heated air from the rear of the PCBs is normally precluded by the need for an interconnection 'mother board' across the rear of all of the plug-in horizontal plane PCBs. Lateral forced air cooling from side to side of the equipment cabinet is sometimes attempted, but this method fails when cabinets are rack-mounted in adjacent '19 inch' cubicles, or are field operated in so-called 'flight cases' with only front and rear access covers removed.

SUMMARY OF THE INVENTION

It is an object of the invention to provide an improved housing for electronic circuit board equipment that overcomes or reduces at least some of the above mentioned disadvantages of known equipment.

The invention accordingly provides a cabinet for electronic equipment comprising an assembly of printed circuit boards stacked in horizontal planes and interconnected by a vertically extending rear mother board, said cabinet including a hollow rectangular housing with top, bottom and side walls, front and rear openings and an internal partition extending generally parallel to a side wall of the housing to define a compartment for receiving said assembly of boards and an adjacent plenum chamber extending along a side wall of the housing, said partition including ventilation opening means for coupling said plenum chamber to said compartment adjacent lateral edges of stacked printed circuit boards to be accommodated therein, and said plenum chamber including an exhaust fan or blower, the arrangement being such that, in use, said fan or blower causes air to be drawn through a front opening of said housing to pass transversely across said stacked circuit boards into said plenum chamber and to be exhausted through a rear opening of the housing.

Further preferred features and advantages of the invention will become apparent from the following description and the subordinate claims.

BRIEF DESCRIPTION OF THE DRAWING

The single FIGURE is a diagrammatic perspective view of an equipment housing in accordance with the invention shown with the top and front panels removed to show internal detail.

DETAILED DESCRIPTION OF PREFERRED EMBODIMENT

Figure 1:
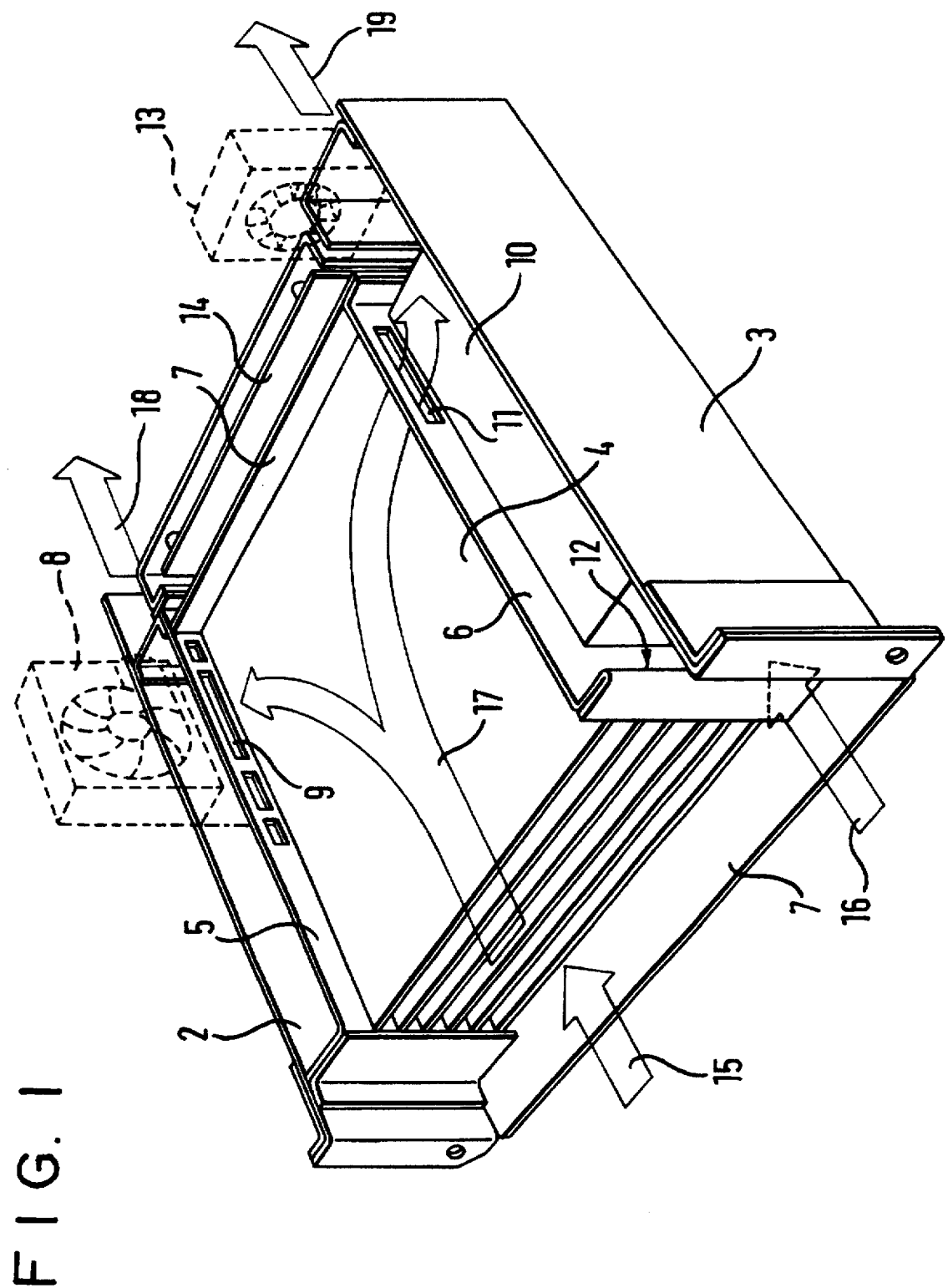

Referring to the drawing, the housing illustrated is constructed to define a standard '19 inch' cabinet of the kind initially referred to above. Thus the shell of the housing comprises a hollow box open to the front and rear and having a base wall 1, side walls 2 and 3 and a top wall that is omitted from the drawing for clarity but extends between side walls 2 and 3 symmetrically with the base wall 1.

The housing is constructed of sheet metal in the conventional manner and the front and rear are closed by hinged metal (or metal coated plastic) access panels fitted with conductive sealing gaskets or spring contact fingers to ensure that adequate electrical continuity is maintained to prevent leakage of electromagnetic radiation. The front access panel is omitted from the drawing for clarity.

A plurality of printed circuit boards 4 each extending in a horizontal plane are stacked vertically, secured between partitions 5 and 6 that extend vertically between the base and top walls of the housing and are arranged in spaced parallel relationship to the side walls 2 and 3.

The printed circuit boards 4 are interconnected at the rear by a so-called mother board 7 in well known manner. The partition 5 defines between itself and the side wall 2 a narrow plenum chamber that is open to the rear of the housing and contains a slim centrifugal blower mounted within and towards the rear of the plenum chamber. The blower is illustrated at 8 in broken lines and shown in a position vertically removed from the plenum chamber for clarity. The partition 5 includes a plurality of vertically arrayed ventilation openings 9 through which air can be drawn from the lateral spaces between the circuit boards 4 and exhausted from the rear of the cabinet by the blower 8. The partition 6 is spaced from the side wall 3 by a slightly greater distance to allow it to accommodate a power supply unit 10 for the equipment including the printed circuit boards 4. The partition 6 also forms a plenum chamber having exhaust apertures 11 adjacent the printed circuit boards 4 and further defines a frontal opening 12 between itself and the side wall 3 through which cooling air can be drawn over the power supply unit 10. At the rear of the plenum chamber formed by partition 6 there is arranged a rearwardly facing axial fan unit 13 arranged to discharge air through a rear opening of the cabinet. As in the case of the blower 8 the fan 13 is shown vertically displaced from the plenum chamber for clarity.

To the rear of the mother board 7 an interconnect board 14 is mounted within the cabinet, and since it is not necessary for the mother board to be interrupted by apertures for the air flow from printed circuit boards 4 it can be coupled to rear panel interface connectors via the interconnect board 14 by means of transition connectors, without relying on internal cabling. This increases reliability and significantly reduces assembly time and manufacturing cost.

The front panel which closes the housing to form a cabinet is provided in a conventional manner not shown with filter material through which air can be drawn. The air passes in the direction of the arrows 15 to 17, over the printed circuit boards 4 and power supply unit 10 and is then discharged from the rear of the cabinet, as already described, in the direction of the arrows 18 and 19.

It will be appreciated that by keeping the lateral widths of the exhaust plenum chambers to a minimum, which is facilitated by the use of slim centrifugal blowers, the horizontal width of the printed circuit boards 4 is not unduly restricted. Effective ventilation is thus achieved whilst maximising the width of available cabinet rear face for the provision of interface cable connectors.

The vertical height of the cabinet may be increased as desired to accommodate more horizontal plane PCBs for a more complex equipment. In this case the PCB dimensions remain identical and different variants of a family of products may be realised with a plurality of the same PCB types. The increased height permits the use of a greater number of vertically stacked centrifugal blowers, power supplies and axial fans to service the increased power demand, and also provides a greater area of front panel input air filter, for increased air flow, and rear panel area for additional interface connectors.

Empty space in the exhaust plenums at each side of the cabinet may be used conveniently to house additional items, such as small disk drive mechanisms, and recessed carrying handles to facilitate equipment handling.

Since the front and rear of the cabinet must open to allow access for operation or maintenance, the torsional rigidity of the cabinet structure is greatly enhanced by the creation of the two side plenum box sections.

It will be appreciated that further alterations or modifications to the arrangement described may be made without departing from the scope of the invention as claimed. For example the plenum chamber and associated exhaust fan or blower 8 or 13 may be omitted from one side of the cabinet, in a case where air exhaust from a single side of the cabinet will be sufficient. Alternatively, both plenum chambers may be identical and incorporate slim radial blowers 8 or power supply units 10 and axial fans 13, as the case may be.

I claim:

1. A stackable electronic equipment assembly comprising a housing, including first and second spaced walls lying in parallel planes and respectively supporting first and second opposed edges of each of a plurality of rectangular printed circuit boards, said boards stacked in spaced parallel planes at right angles to said walls, a mother board interconnecting third edges of each of said printed circuit boards and extending in a plane at right angles to said parallel planes, a third wall extending parallel to said first wall on a side thereof remote from said printed circuit boards to define a plenum chamber extending adjacent said first edges of said printed circuit boards, an air extraction fan located within said plenum chamber at an end thereof terminating adjacent the plane of said mother board and having an exhaust opening extending generally normal to said plane of the mother board, and ventilation apertures arranged in said first wall at locations between said circuit boards and adjacent said mother board, the arrangement being such that the said housing presents closed opposite sides extending parallel to said walls, for connection of said assembly into a rack or cubicle in stacked relation to other like assemblies, and that in use the said extraction fan draws ventilation air through spaces between fourth edges of said circuit boards, towards said mother board and thence through said apertures and into the plenum chamber, and then discharges the ventilation air through said exhaust opening.

2. An assembly according to claim 1 wherein said extraction fan comprises a slim centrifugal blower having its axis perpendicular to the plane of said first wall whereby air is drawn axially through said ventilation apertures and discharged radially through said exhaust opening.

3. An assembly according to claim 1, wherein said plenum chamber contains a power supply unit of the electronic equipment and said fan comprises an axial fan blower with its axis generally parallel to the plane of said first wall.

4. A stackable electronic equipment assembly, comprising a housing including first and second spaced parallel walls respectively supporting first and second opposed edges of each of a plurality of rectangular printed circuit boards, said boards stacked in spaced parallel planes at right angles to said walls, a mother board interconnecting third edges of each of said printed circuit boards and extending in a plane at right angles to said parallel planes, a third wall extending parallel to said first wall on a side thereof remote from said printed circuit boards to define a first plenum chamber extending adjacent said first edges of said printed circuit boards, a fourth wall extending parallel to said second wall on a side thereof remote from said printed circuit boards to define a second plenum chamber extending adjacent said second edges of said printed circuit boards, a first air extraction fan located within said first plenum chamber at an end thereof terminating adjacent the plane of said mother board and having an exhaust opening extending generally normal to said plane of the mother board, and ventilation apertures arranged in said first and second walls at locations between said circuit boards and adjacent said mother board, the arrangement being such that the said housing presents closed opposite sides extending parallel to said walls, for connection of said assembly into a rack or cubicle in stacked relation to other like assemblies, and that in use the said extraction fan draws ventilation air through spaces between fourth edges of said circuit boards, towards said mother board and thence through said apertures and into the two plenum chambers, and then discharge the ventilation air through said exhaust opening.

5. An assembly according to claim 4, wherein said fan in said first plenum chamber comprises a slim centrifugal blower having its axis perpendicular to the plane of said first wall whereby air is drawn axially through said ventilation apertures of the first wall and discharged radially through said exhaust opening.

6. An assembly according to claim 5, wherein said second plenum chamber contains a power supply unit of the electronic equipment and said fan therein comprises an axial fan with its axis generally parallel to the plane of said fourth wall.

* * * * *